US010579748B2

(12) United States Patent
Zink et al.

(10) Patent No.: US 10,579,748 B2
(45) Date of Patent: Mar. 3, 2020

(54) CAPACITY PLANNING FOR SYSTEMS WITH MULTIPROCESSOR BOARDS

(71) Applicant: CA, Inc., New York, NY (US)

(72) Inventors: Kenneth Zink, Austin, TX (US);
Douglas Neuse, Austin, TX (US)

(73) Assignee: CA, Inc., New York, NY (US)

( * ) Notice: Subject to any disclaimer, the term of this patent is extended or adjusted under 35 U.S.C. 154(b) by 366 days.

(21) Appl. No.: 14/674,410

(22) Filed: Mar. 31, 2015

(65) Prior Publication Data

US 2016/0292318 A1 Oct. 6, 2016

(51) Int. Cl.
*G06F 17/50* (2006.01)
*G06F 11/34* (2006.01)

(52) U.S. Cl.
CPC ...... *G06F 17/5009* (2013.01); *G06F 11/3442* (2013.01)

(58) Field of Classification Search
CPC ............. G06F 17/5009; G06F 17/5022; G06F 17/5045; G06F 17/5036
See application file for complete search history.

(56) References Cited

U.S. PATENT DOCUMENTS

| | | | |
|---|---|---|---|
| 7,957,948 B2 | 6/2011 | Zink et al. | |
| 8,250,198 B2* | 8/2012 | Zhang | G06Q 10/06 709/200 |
| 2004/0153749 A1* | 8/2004 | Schwarm | G06F 11/2038 714/11 |
| 2006/0013134 A1* | 1/2006 | Neuse | H04L 41/082 370/230 |
| 2008/0077366 A1* | 3/2008 | Neuse | G06Q 30/0283 703/2 |
| 2009/0055823 A1* | 2/2009 | Zink | G06F 11/3419 718/100 |

(Continued)

OTHER PUBLICATIONS

Arne B. Mikalsen, Hardware components with focus on servers, The learning material is developed for the course LV463D LAN Management Jan. 20, 2009, p. 1-20 (Year: 2009).*

(Continued)

*Primary Examiner* — Rehana Perveen
*Assistant Examiner* — Chuen-Meei Gan
(74) *Attorney, Agent, or Firm* — Baker Botts L.L.P.

(57) ABSTRACT

Methods of analyzing and capacity planning for multi-core, multi-chip, multi-threaded computer system environments by analyzing the scalability of a fourth layer complexity, the processor boards, and incorporating this factor into the calculation of the expected throughput of a system constructed with multiple processor boards. In particular, the method may comprise identifying a system for which system performance prediction is desired, specifying a simulation model, and determining configuration parameters for the system, the system with at least one processor board, at least one chip per board, at least one core per chip, and at least one thread per core. The method may further comprise obtaining scalability factors based on the configuration data for the system, executing a simulation process for the simulation model for a deterministic simulation time, calculating a throughput of the system as a prediction of the performance of the system, and storing the results in a storage device.

16 Claims, 10 Drawing Sheets

| Vendor | Model | Processor | MHz | Processor Boards | Effective Boards | Chips/ Board | Effective Chips | Cores/ Chip | Effective Cores | Threads/ Core | Effective Threads | Equivalent CPUs | Computed SPEC int optimized | Measured SPEC int Rate opt. | Computed SPEC int Rate opt. |
|---|---|---|---|---|---|---|---|---|---|---|---|---|---|---|---|
| | | | | Cell Scalability | | Chip Scalability | | Core Scalability | | Thread Scalability | | | Measured SPEC int optimized | | |
| | | | | Linear | Expon | Linear | Expon | Linear | Expon | Linear | Expon | | | | |
| | | | | 0.986 | 1.000 | 0.937 | 0.930 | 0.980 | 0.900 | 1.000 | 1.000 | | 25.1 | | |
| Unisys | ES7000 Model 7600R | Xeon X7460 | 2667 | 2 | 1.99 | 4 | 3.07 | 6 | 3.48 | 1 | 1.00 | 21.00 | 25.092992 | 527 | 527.15 |
| Unisys | ES7000 Model 7600R | Xeon X7460 | 2667 | 3 | 2.97 | 4 | 3.07 | 6 | 3.48 | 1 | 1.00 | 31.43 | 25.074307 | 788 | 788.81 |
| Unisys | ES7000 Model 7600R | Xeon X7460 | 2667 | 4 | 3.96 | 4 | 3.07 | 6 | 3.48 | 1 | 1.00 | 41.85 | 25.088822 | 1050 | 1050.47 |

Unisys ES7000 Cells (Boards) & Chips/Cell & Cores/Chip & Threads/Core

(56) References Cited

U.S. PATENT DOCUMENTS

| | | | | |
|---|---|---|---|---|
| 2012/0130680 A1* | 5/2012 | Zink | ............... | G06F 11/3442 |
| | | | | 702/186 |
| 2012/0144170 A1* | 6/2012 | Singh | ............... | G06F 9/526 |
| | | | | 712/223 |
| 2012/0311606 A1* | 12/2012 | Marathe | ............... | G06F 9/526 |
| | | | | 718/107 |
| 2013/0290967 A1* | 10/2013 | Calciu | ............... | G06F 9/526 |
| | | | | 718/102 |
| 2014/0019964 A1* | 1/2014 | Neuse | ............... | G06F 9/45533 |
| | | | | 718/1 |
| 2015/0371244 A1* | 12/2015 | Neuse | ............... | G06Q 30/0202 |
| | | | | 705/7.31 |

OTHER PUBLICATIONS

TechWeb, Speedup Ratio and Parallel Efficiency, Boston University, 2014, p. 1-4 (Year: 2014).*
Lecture note 5. Network Simulation p. 161-226 (Year: 2006).*
Hardavellas, Nikolaos, et al. "Sinnflex: A fast, accurate, flexible full-system simulation framework for performance evaluation of server architecture." ACM Sigmetrics Performance Evaluation Review 31.4 (2004): 31-34. (Year: 2004).*
Lal Bahadur Naidu Lecture note "Computer Hardware and Networking" https://sites.google.com/site/cprorgrams/home (Year: 2013).*
Jonathan Hu, website 4 Ways to Find out What's the Motherboard Model for Your Windows 7 & 10 Computer—Next of Windows https://www.nextofwindows.com/4-ways-to-find-out-whats-the-motherboard-model-inside-your-windows-7-machine (Year: 2012).*

* cited by examiner

| | 802 | 804 | 806 | 808 | 810 | 812 | 814 | 816 | 818 |
|---|---|---|---|---|---|---|---|---|---|
| | SYSTEM | PROCESSOR BOARD TYPE | NUMBER OF BOARDS | PROCESSOR CHIP TYPE | CHIPS/ BOARD | CORES/ CHIP | THREADS/ CORE | MEASURED THROUGHPUT S_meas | MEASURED THROUGHPUT RATE, R_meas |
| RECORD 1 | | | | | | | | | |
| RECORD 2 | | | | | | | | | |
| ... | | | | | | | | | |
| RECORD Z | | | | | | | | | |

| i | $L(i)$ | $E(i)$ |
|---|---|---|
| BOARD SCALABILITY | 0.986 | 1.000 |
| CHIP SCALABILITY | 0.937 | 0.930 |
| CORE SCALABILITY | 0.980 | 0.900 |
| THREAD SCALABILITY | 1.000 | 1.000 |

CAPACITY PLANNING FOR SYSTEMS WITH MULTIPROCESSOR BOARDS

BACKGROUND

The disclosure relates generally to capacity planning for computer systems, and more specifically to a method for capacity planning for systems with multiprocessor boards.

SUMMARY

According to one embodiment of the disclosure, a method comprises identifying a system for which system performance prediction is desired, specifying a simulation model, determining configuration parameters for the system, the system comprising at least one processor board, at least one chip per board, at least one core per chip, and at least one thread per core, obtaining scalability factors based on the configuration data for the system, executing a simulation process for the simulation model for a predetermined simulation time, calculating a throughput of the system as a prediction of the performance of the system, and storing the results in a storage device.

Other features and advantages of the present disclosure are apparent to persons of ordinary skill in the art in view of the following detailed description of the disclosure and the accompanying drawings.

BRIEF DESCRIPTION OF THE DRAWINGS

For a more complete understanding of the configurations of the present disclosure, needs satisfied thereby, and the features and advantages thereof, reference now is made to the following description taken in connection with the accompanying drawings.

FIGS. 8 and 9 illustrate data maintained in a performance data repository of a system performance prediction module, in accordance with a particular embodiment of the present disclosure.

DETAILED DESCRIPTION

Figure 1:
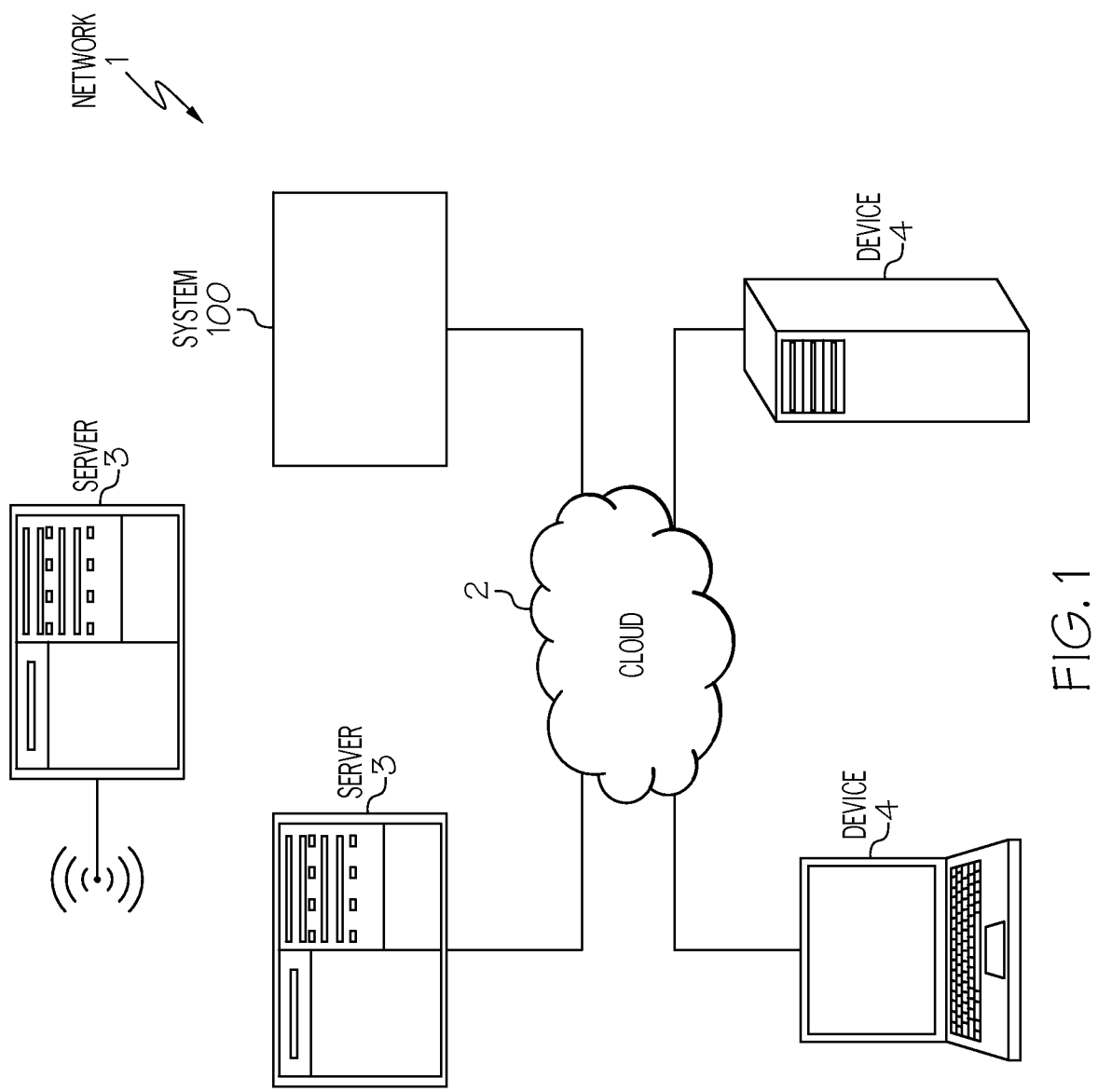
FIG. 1 illustrates a block diagram of a network for a user to access a system performance analysis module and a system performance prediction module, in accordance with a particular embodiment of the present disclosure.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory ("RAM"), a read-only memory ("ROM"), an erasable programmable read-only memory ("EPROM" or Flash memory), an appropriate optical fiber with a repeater, a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language, such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FOR- TRAN® 2003, Perl, COBOL 2002, PHP, ABAP®, dynamic programming languages such as PYTHON®, RUBY® and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to aspects of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

While certain example systems and methods disclosed herein may be described with reference to mainframes in cloud computing, systems and methods disclosed herein may be related to architecture and information technology ("IT") service and asset management in cloud computing, as well as usability and user experience in middleware and common services. Systems and methods disclosed herein may be applicable to a broad range of applications that monitor various parameters associated with various disciplines, such as, for example, IT systems and other activities of importance to the user.

Referring now to FIG. 1, a network 1 allows a user to access and use a system performance analysis module and a system performance prediction module. The system performance analysis module and the system performance prediction module may be internally provided or sourced through third parties. In addition, the system performance analysis module and system performance prediction module may be stored in a memory for use with a computer, or maintained and accessible via cloud storage, as discussed below. In particular, network 1 may comprise one or more clouds 2, which may be public clouds, private clouds, or community clouds. Each cloud 2 may permit the exchange of information and services among users that are connected to such clouds 2. In certain configurations, cloud 2 may be a wide area network, such as the Internet. In some configurations, cloud 2 may be a local area network, such as an intranet. Further, cloud 2 may be a closed, private network in certain configurations, and cloud 2 may be an open network in other configurations. Cloud 2 may facilitate wired or wireless communications of information among users that are connected to cloud 2.

Network 1 may comprise one or more servers 3 and other devices operated by service providers and users. Network 1 also may comprise one or more devices 4 utilized by users. Service providers and users may provide information to each other utilizing the one or more servers 3, which connect to the one or more devices 4 via cloud 2. Servers 3 may comprise, for example, one or more of general purpose computing devices, specialized computing devices, mainframe devices, wired devices, wireless devices, monitoring devices, infrastructure devices, and other devices configured to provide information to service providers and users. Devices 4 may comprise, for example, one or more of general purpose computing devices, specialized computing devices, mobile devices, wired devices, wireless devices, passive devices, routers, switches, mainframe devices, monitoring devices, infrastructure devices, and other devices utilized by service providers and users. Example items may include network 1, cloud 2, servers 3, and devices 4.

Moreover, network 1 may comprise one or more systems 100 that may provide a system performance analysis module and/or a system performance prediction module. System 100 may be, for example, one or more of a general purpose computing device, a specialized computing device, a wired device, a wireless device, a mainframe device, an infrastructure device, a monitoring device, and any other device configured to provide the system performance analysis module and the system performance prediction module. System 100 may also be configured to collect data from one or more data sources (e.g., servers, sensors, networks, interfaces, other devices). System 100 may collect information from network 1, cloud 2, servers 3, devices 4, and other devices connected to cloud 2. System 100 may connect to cloud 2 and monitor network 1, cloud 2, servers 3, devices 4, and other devices connected to cloud 2 for available information. The available information may include processor board information, chips per board information, cores per chip information, threads per core information, measured throughput rate information (e.g., based on industry testing), and other information provided to the system performance analysis module and the system performance prediction module. By collecting the available information from network 1, cloud 2, servers 3, devices 4, and other devices connected to cloud 2, system 100 may perform one or more tasks associated with using the system performance analysis module and the system performance prediction module, which is discussed in more detail below. In some configurations, one or more of servers 3 and devices 4 may comprise system 100. In other configurations, system 100 may be separate from servers 3 and devices 4.

Generally, computer server capacity planning and enterprise application performance engineering have become areas of considerable interest for businesses looking to optimize performance of their business applications in large and complex systems. In particular, the workloads processed by these applications and infrastructure in which they execute change over time. As such, these companies are primarily interested in determining (1) the impact of such anticipated or hypothetical changes, and (2) when anticipated increases in workload levels will exceed the capacity of the existing infrastructure. To do this, these companies may measure the current performance of their business applications, load-test their applications in a test lab or estimate such measurements during application design, and then build performance models using these measurements and using these models to predict how performance will change in response to anticipated or hypothetical changes to the workloads, applications, and infrastructure.

U.S. Pat. No. 7,957,948 B2, and the continuation Patent Application Publication No. US 2012/0130680 (collectively, "the patent"), which are incorporated herein by reference in their entirety, describe systems and methods for capacity planning for systems with multithreaded multicore multiprocessor resources. This patent generally describes processor architectures utilizing a plurality of CPU chips, with a plurality of cores per chip and multithreading per core, and is directed to facilitating the evaluation of the performance effects of all anticipated changes to workloads, applications, and infrastructure in view of this chip-core-thread structure. For example, this patent discusses the scenario where a source data center configuration is analyzed and source parameters are determined, and a destination data center configuration is analyzed and destination parameters are determined, to help an IT manager to understand what the performance of the destination data center configuration will be relative to the source data center configuration so as to optimize the destination data center configuration for performance, cost, upgradeability or other features. This analysis is particularly important due to the non-linear scalability effects in multi-chip, multi-core and multi-thread environments when hardware resources such as cache memory and disks are shared by these multiple chip, multiple cores and multiple threads. Even with the introduction of multiple levels of cache memory (L2 or L3 cache), memory access continues to be a performance issue because processor speeds (clock rates) have increased by orders of magnitude while memory access speeds have only increased by factors in single or double digits. Thus, this patent provides for a method of analyzing a multi-chip, multi-core, multi-threaded system architecture for the purposes of producing capacity planning in multi-chip, multi-core, and multi-thread environments.

Figure 2:
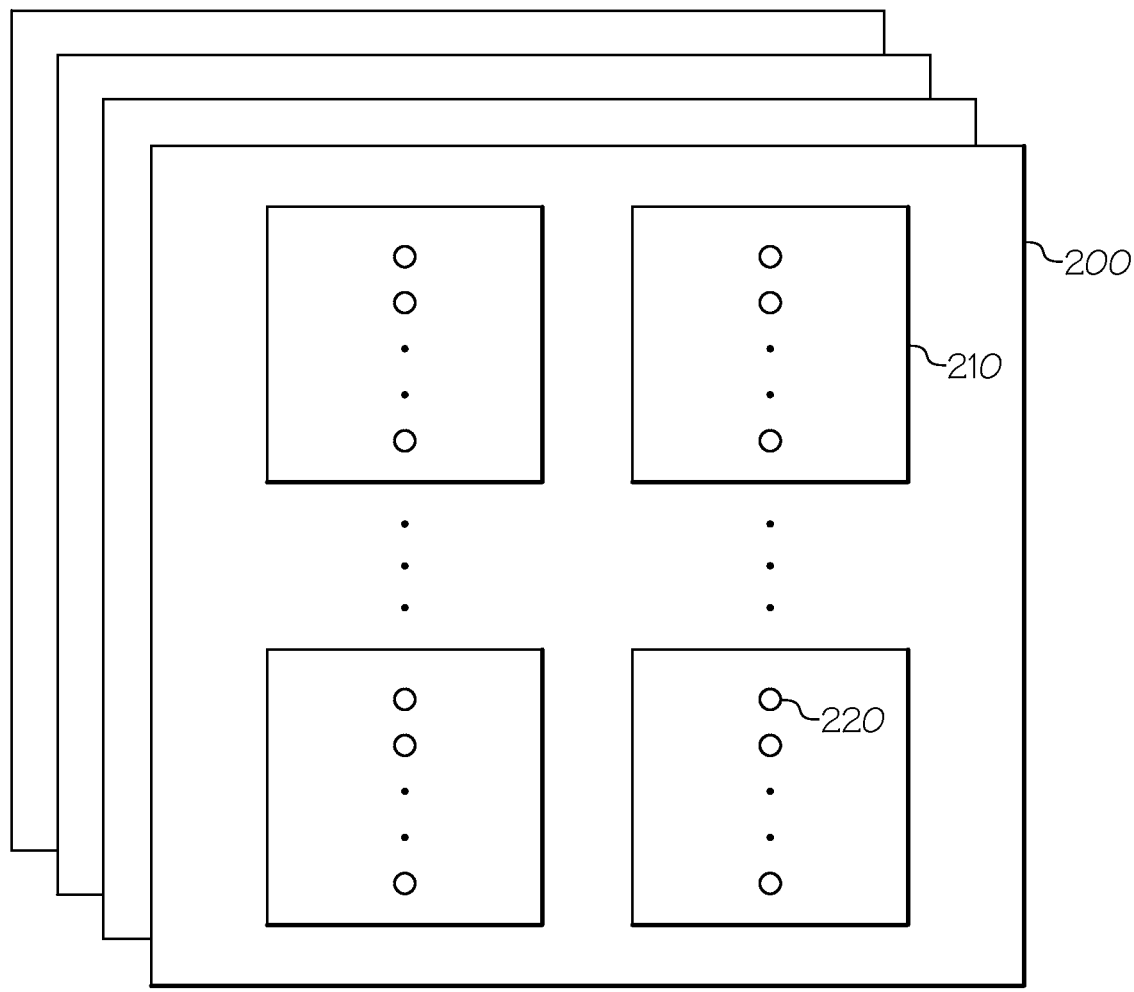
FIG. 2 illustrates a block diagram of a computer system architecture incorporating multiple chips, multiple cores per chip, and multiple threads per core, in accordance with a particular embodiment of the present disclosure.

As an example, FIG. 2 depicts a multichip-multicore-multithread system. Processor chips 200 are shown wherein each chip may contain a plurality of microprocessor cores 210, a microprocessor core having, for example, its own instruction pipeline. Within each core 210, it is possible to fork the instruction pipeline into multiple logical processor threads 220, wherein each thread may be activated to execute program instructions for different programs or may be activated to execute instructions in parallel for a single program.

Programming instructions assigned to and being executed on a processor thread is referred to as a task; the terminology "active thread" means a processor thread with a task currently assigned and executing. When processor threads 220 are activated, the operating system will typically allocate tasks to processor threads most efficiently by minimizing the number of active threads per chip 200 and minimizing the number of active threads per core 210 so that on-chip resources are less likely to require sharing.

More recently, however, with the increase in number of cores per chip, computer architects have responded by adding more and larger caches to reduce the number of required access to memory as the memory bus was becoming a performance bottleneck. With even more cores per chip, corresponding to supporting more threads of execution, a common architectural approach has been to design processor boards which incorporate two or four processor chips, and their associated caches, memory chips and a memory bus on a single board. Larger systems are created by supporting multiple such boards in a system running a single instance of an operating system. Inter-board cabling supports access to memory and cache coherency between an execution thread on one board and the memory on a different board but the operating system is "board-aware" and will allocate CPU and memory resources associated with a thread of execution on the same board to the extent possible. Thus, this resource allocation policy significantly reduces the amount of NUMA ("Non-Uniform Memory Access") behavior exhibited by execution streams.

Since each processor board effectively has memory dedicated to its threads of execution and a private memory bus, there is less contention for access to memory than would occur on a similar sized system with a single shared memory and memory bus. As a result, systems constructed of multiple processor boards typically exhibit higher overall performance that similarly sized systems with a single shared memory and bus. For example, adding another processor board to an existing system will typically exhibit an increase in performance that is closer to linear than adding an equivalent amount of processors and memory to a single, shared memory system.

Figure 3:
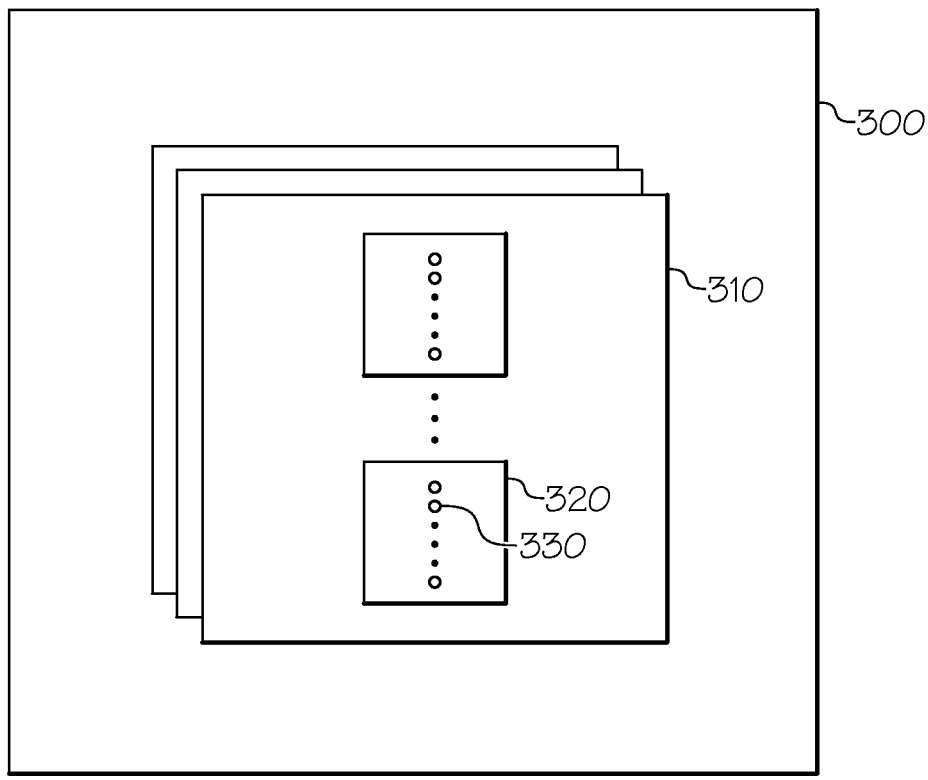
FIG. 3 illustrates a block diagram of a computer system architecture incorporating multiple boards, multiple chips per board, multiple cores per chip, and multiple threads per core, in accordance with a particular embodiment of the present disclosure.
Figure 3:
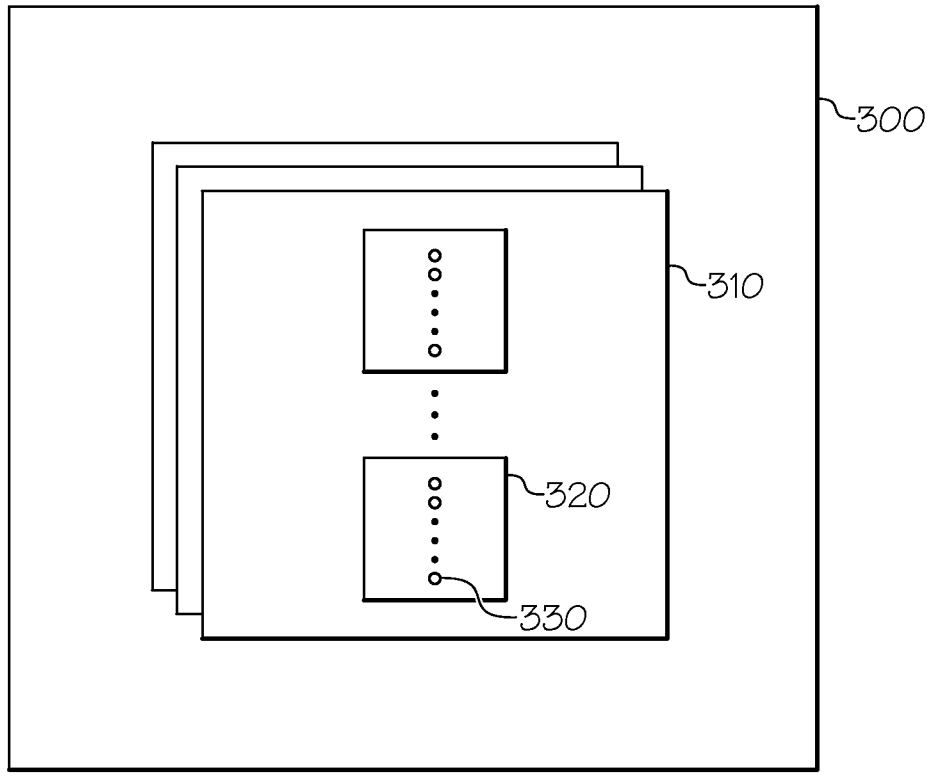

As an example, FIG. 3 depicts a multi-board, multi-chip, multi-core, multi-thread system. Processor boards 300 are shown wherein each board may contain a plurality of processor chips 310, each chip 310 may contain a plurality of microprocessor cores 320, and each core 320 may have multiple logical processor threads 330, wherein each thread may be activated to execute program instructions for different programs or may be activated to execute instructions in parallel for a single program. When processor threads 330 are activated, the operating system will typically allocate tasks to processor threads most efficiently by minimizing the number of active processor threads per processor core 320, minimizing the number of active threads per chip 310, and minimizing the number of active threads per processor board 300, so that on-board, on-chip, and on-core resources are less likely to be shared.

Thus, the present disclosure seeks to extend the methods of analyzing and capacity planning for multi-chip, multi-core, multi-threaded system environments by analyzing the scalability of a fourth layer of complexity, the processor boards, and incorporating this factor into the calculation of the expected throughput of a system constructed with multiple processor boards. In doing so, the teachings of the present disclosure may provide a system performance analysis module that gathers performance data and analyzes the data by type of boards and chips, number of boards, number of chips per board, number of cores per chip, and number of supported threads per core for the purpose of determining a set of scalability factors, and then employing these scalability factors to multi-board, multi-chip, multi-core, multi-thread system architectures for the purposes of capacity planning.

Figure 4A:
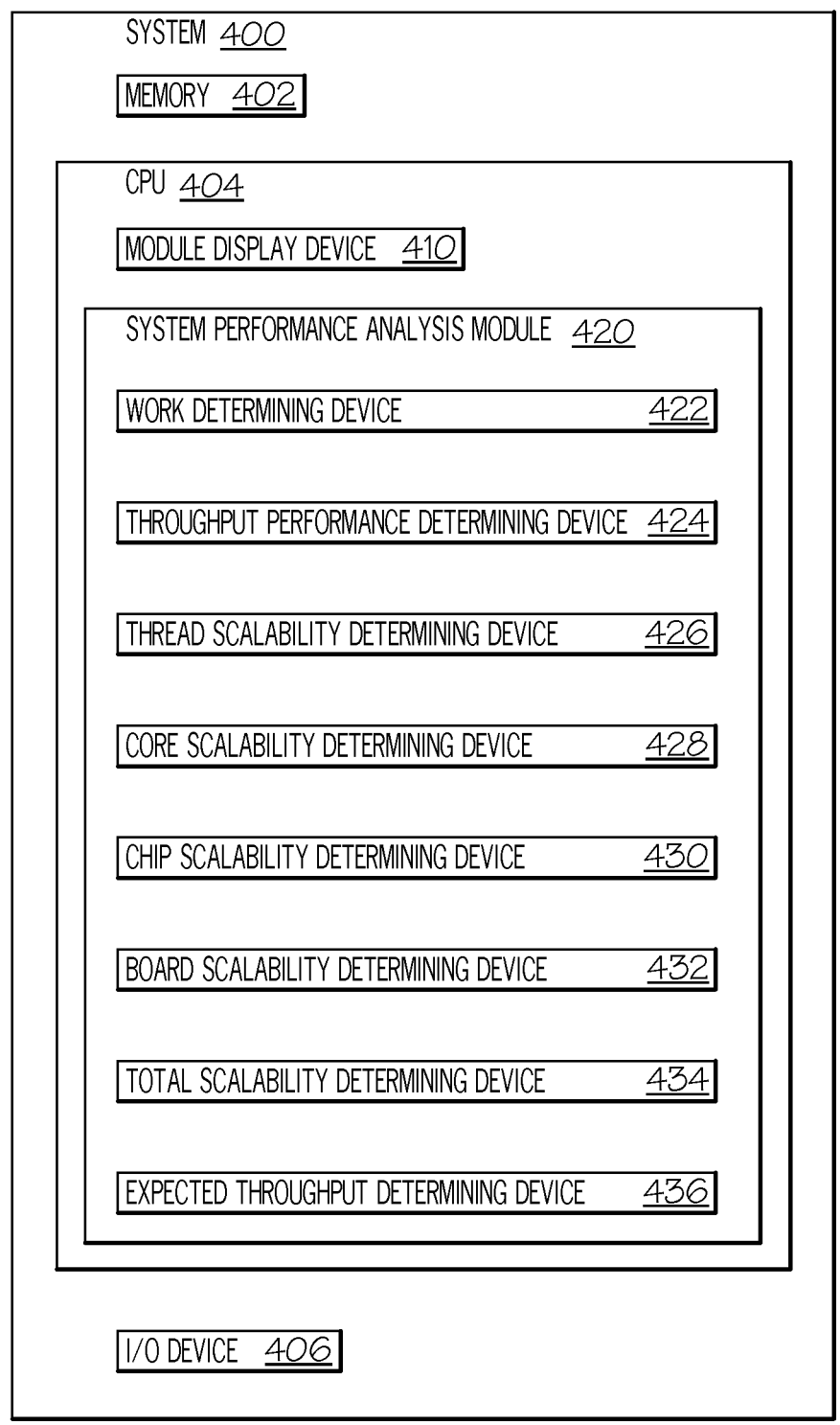
FIG. 4A illustrates a block diagram of a system presenting the system performance analysis module, in accordance with a particular embodiment of the present disclosure.

Referring now to FIG. 4A, system 400, which may provide a system performance analysis module, is now described. The system performance analysis module may gather CPU performance data and analyze the characteristics of the operating system, the number of boards, the number of chips per board, the number of cores per chip, and the number of supported threads per core to determine a set of scalability factors, which includes both linear and exponential scaling factors. It is noted that these scalability factors are all less than or equal to 1 for all analyzed systems to date (over 6000) because scalability factors greater than 1.0 would imply that the system becomes more efficient as more boards/chips/cores/threads are added, for which no extant commercial systems have been observed—but neither the analysis methodology nor the scalability representation specifically exclude this (unlikely) possibility.

The system performance analysis module may be located on a device 4 and accessible via system 400, or may be located on cloud 2 (e.g., a virtual system) and accessible via system 400. System 100 may reside on one or more networks 1. System 400 may comprise a memory 402, a CPU 104, and an input and output ("I/O") device 406.

Memory 102 may store computer-readable instructions that may instruct system 400 to perform certain processes. As discussed above, memory 402 may comprise, for example, RAM, ROM, EPROM, Flash memory, or any suitable combination thereof. In particular, when executed by CPU 404, the computer-readable instructions stored in memory 402 may instruct CPU 404 to operate as one or more devices.

CPU 404 may operate as one or more of a module display device 410 and a system performance analysis device 420. System performance analysis device 420 may comprise one or more of a work determining device 422, a throughput performance determining device 424, a thread scalability determining device 426, a core scalability determining device 428, a chip scalability determining device 430, a board scalability determining device 432, a total scalability determining device 434, and an expected throughput determining device 436, as discussed in detail below.

I/O device 406 may receive one or more of data from networks 1, data from other devices connected to system 400, and input from a user and/or a system and provide such data to CPU 404. I/O device 406 may transmit data to networks 1, may transmit data to other devices connected to system 400, and may transmit information to a user (e.g., display the information via a display device). Further, I/O device 406 may implement one or more of wireless and wired communication between system 400 and other devices.

Figure 4B:
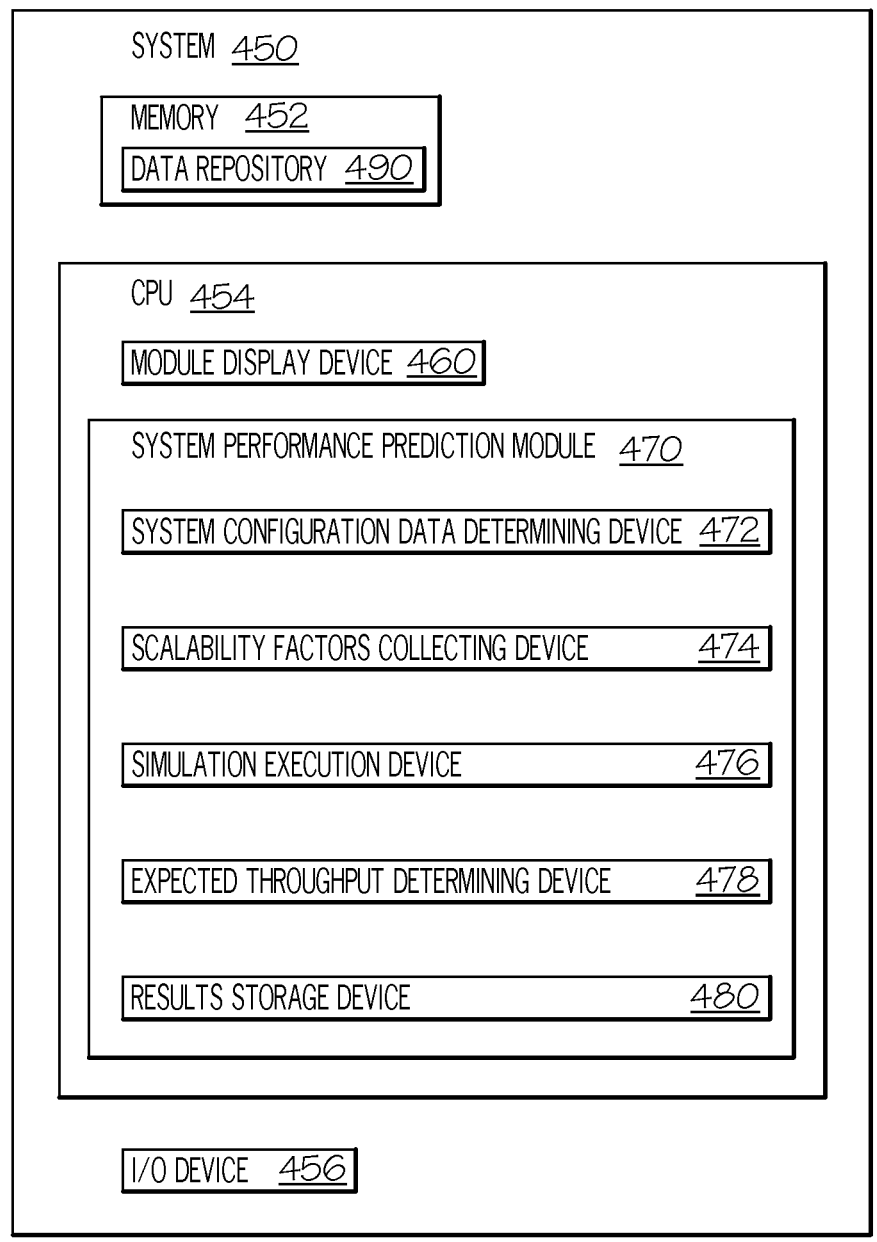
FIG. 4B illustrates a block diagram presenting the system performance prediction module, in accordance with a particular embodiment of the present disclosure.

Referring now to FIG. 4B, system 450, which may provide a system performance prediction module, is now described. The system performance prediction module may employ the scalability factors determined by the system performance analysis module for multi-thread, multi-core, multi-chip, and multi-board system architectures for the purposes of capacity planning.

The system performance prediction module may be located on a device 4 and accessible via system 450, or may be located on cloud 2 (e.g., a virtual system) and accessible via system 450. System 450 may reside on one or more networks 1. System 450 may comprise a memory 452, a CPU 454, and an input and output ("I/O") device 456. Similar to memory 402 and I/O device 406 described above with respect to FIG. 4A, memory 452 may store computer-readable instructions that may instruct system 450 to perform certain processes, and I/O device 456 may receive data from network 1, data from other devices connected to system 450, input from a user and/or a system to provide such data to CPU 454; transmit data to networks 1, other devices connected to system 450, and transmit data to a user; and implement one or more of wireless and wired communication between system 450 and other devices.

CPU 454 may operate as one or more of a module display device 460 and a system performance prediction device 470. System performance prediction device 470 may comprise one or more of a system configuration data determining device 472, a scalability factor collecting device 474, a workload specification device 476, and an expected throughput determining device 478, as discussed in detail below.

Figure 5:
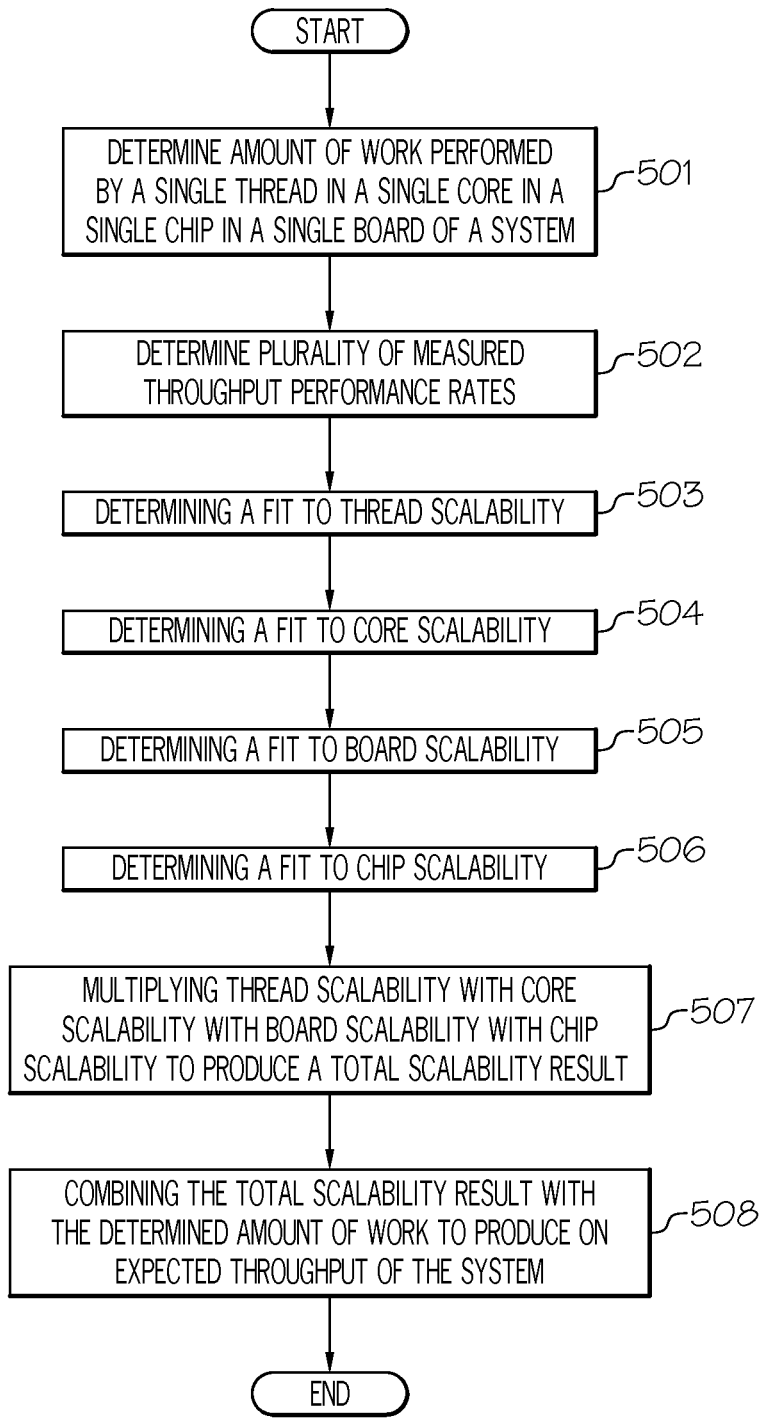
FIG. 5 illustrates a flow diagram of the method performed by the system performance analysis module, in accordance with a particular embodiment of the present disclosure.
Figure 6:
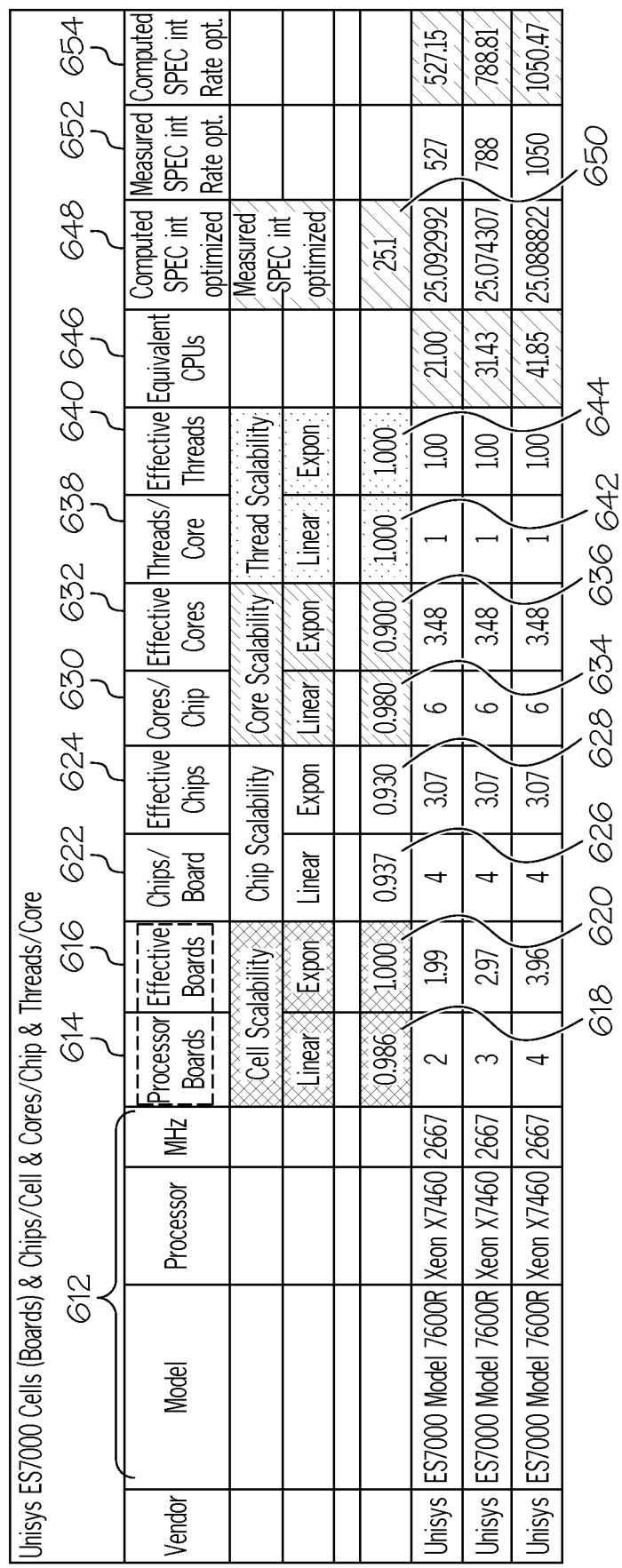
FIG. 6 illustrates an exemplary example of the calculation of the expected throughput of a system, in accordance with a particular embodiment of the present disclosure.

Referring now to FIGS. 5 and 6, processes performed by system performance analysis device 420, which analyzes the collected performance data for the purpose of determining a set of scalability factors, are now described.

In step 501 of FIG. 5, system performance analysis device 420, operating as work determining device 422, determines the amount of work performed by a single thread in a single core in a single chip in a single board of a system 612 comprising a number of N processor boards, where N is an integer greater than or equal to 1 (i.e., measured single thread performance 650). System 612, for example, may be a Unisys ES7000 Model 7600R, with a processor type Xeon X7460 with a nominal clock frequency of 2667 MHz (FIG. 6). As shown in FIG. 6, N can equal 2, 3, or 4 process boards 614 (or any other suitable integer number of process boards based on system capabilities). The measured single thread performance 650 may be determined from SPECint2006, from Standard Performance Evaluation Corporation (SPEC), found on the SPEC.org website.

Then, in step 502 of FIG. 5, system performance analysis device 420, operating as throughput performance determining device 424, determines a plurality of measured throughput performance rates 652 for each of the number of N processor boards. The measured throughput performance rates 652 may be determined from SPECint_rate2006, from Standard Performance Evaluation Corporation (SPEC), found on the SPEC.org website. In addition, as shown in FIG. 6, the system with 2 processor boards corresponds to a measured throughput performance rate of 527, the system with 3 processor boards corresponds to a measured throughput performance rate of 788, and the system with 4 processor boards corresponds to a measured throughput performance rate of 1050.

In step 503 of FIG. 5, system performance analysis device 420, operating as thread scalability determining device 426, determines a fit to thread scalability. Specifically, system performance analysis device 420 determines a fit to thread scalability by determining the number of threads per core associated with the system, determines linear and exponential scalability factors based on the performance throughput of the threads per core, and calculates an effective threads per core result 640 based on the linear and exponential thread scalability factors. It is noted that both linear and exponential scalability factors are less than or equal to 1.0, as described in Section [33].

Ideally, to determine the thread scalability factors the measured throughput performance data would include measurements with only one thread per core active, two threads per core active, etc., up to the maximum number of threads per core for the system under analysis. In practice, this level of detailed performance data is not available but can be approximated by dividing the maximum throughput of a board by the number of cores (not chips) on the board with the result being a (fairly accurate) estimate of the throughput of a single core with all threads active. If there is a maximum of two threads per core for the system under analysis, this represents a complete set of thread performance data. In this case, the thread scalability can be represented with only a linear scalability factor and the exponential scalability factor set to 1.0. For systems with more than two threads per core (e.g., four or eight) it may be necessary to apply some experience from similar systems to select appropriate linear and exponential factors to fit the two available data points. (For example, from prior experience it may be known that the performance throughput contribution of additional threads beyond two for a particular processor architecture provide limited increases in throughput which will imply an exponential scalability factor smaller (i.e., having a greater impact on performance degradation) than a processor architecture which produces more linear contributions to throughput as additional threads per core become active.)

In the degenerate case where there is a maximum of one thread per core (as in the following example) both the linear and exponential thread scalability factors are set to 1.0 which means that there is no implication to performance throughput attributable to thread scalability. Note that this analysis was discussed extensively in the prior patent.

For example, as shown in FIG. 6, system 612 may have one thread per core 638 for each of 2 processor boards, 3 processor boards, or 4 processor boards. In other words, system 612 only supports one thread per core. Then, because there is only one thread per core, linear thread scalability factor 642 is determined to be 1, and exponential thread scalability factor 644 is determined to be 1. In other words, because there is only one thread, no clashing of resources and no scalability effects will occur due to multiple threads per core.

The effective threads per core result 640 (i.e., the throughput equivalent number of threads per core in use at any time in view of the available resources) is calculated based on the determined linear thread scalability factor 642 and exponential thread scalability factor 644. Specifically, the effective threads per core result 640 is determined according to:

$$[1+(T-1) \times L(T)] \times E(T)^{(T-1)}, \qquad \text{Equation 1A}$$

where
T=the number of threads per core associated with the system,
L(T)=the linear thread scalability factor, and
E(T)=the exponential thread scalability factor.

For system 612, the effective threads per core result 640 is equal to 1 whether the number of processor boards equals 2, 3, or 4 ($[1+(1-1) \times 1] \times 1^{(1-1)}=1$). In fact, in this analysis based on the maximum throughput of the system for each of the number of boards installed in the system, the effective threads per core in independent of the number of boards installed.

Alternatively, the effective threads per core result 640 may be determined according to Equation 1B as follows, which is preferable in some cases, but similarly effective in all other cases:

$$1+[(T-1 \times L(T)] \times E(T)^{(T-1)}, \qquad \text{Equation 1B}$$

where
T=the number of threads per core associated with the system,
L(T)=the linear thread scalability factor, and
E(T)=the exponential thread scalability factor.

Next, in step 504 of FIG. 5, system performance analysis device 420, operating as core scalability determining device 428, determines a fit to core scalability. Specifically, system performance analysis device 420 determines a fit to core scalability by determining the number of cores per chip associated with the system, determining linear and exponential scalability factors based on the number of cores per chip, and calculating an effective cores per chip result based on the linear and exponential core scalability factors. Ideally, to determine the core scalability factors the measured throughput performance data would include measurements with only one core per chip active (and all threads on that core active), two cores per chip active, etc., up to the maximum number of cores per chip for the system under analysis. In practice, this level of detailed performance data is not available but can be approximated by dividing the maximum throughput of a board by the number of chips on the board with the result being a (fairly accurate) estimate of the throughput of a single chip with all cores and threads active. Using the previously determined single thread throughput performance 650 and the effective threads per core result 640 the throughput of a single active core can be computed. If there is a maximum of two cores per chip for the system under analysis, this represents a complete set of core performance data—throughput per core with only one core active and with two (all) cores active. In this case, the core scalability can be represented with only a linear scalability factor and the exponential scalability factor set to 1.0. For systems with more than two cores per chip (e.g., four or eight or sixteen) it may be necessary to apply some experience from similar systems to select appropriate linear and exponential factors to fit the two available data points. (For example, from prior experience it may be known that the performance throughput contribution of additional cores beyond two for a particular processor architecture provide limited increases in throughput which will imply an exponential scalability factor smaller (i.e., having a greater impact on performance degradation) than a processor architecture which produces more linear contributions to throughput as additional cores per chip become active.)

In the degenerate case where there is a maximum of one core per chip both the linear and exponential thread scalability factors are set to 1.0 which means that there is no implication to performance throughput attributable to core scalability. Note that this analysis was discussed extensively in the prior patent.

For example, as shown in FIG. 6, system 612 may have 6 cores per chip 630 for each of 2 processor boards, 3 processor boards, and 4 processor boards. In other words, system 612 supports the use of up to 6 cores per chip. Then, linear core scalability factor 634 is determined to be 0.98, and exponential core scalability factor 636 is determined to be 0.90. These scalability factors may be estimated based on, for example, analysis of other similar or suitable systems.

The effective cores per chip result 632 (i.e., the throughput equivalent number of cores per chip in use at any time in view of the available resources) is calculated based on the determined linear core scalability factor 634 and exponential core scalability factor 636. Specifically, the effective cores per chip result 632 is determined according to:

$$[1+(C-1) \times L(C)] \times E(C)^{(C-1)}, \qquad \text{Equation 2A}$$

where
C=the number of cores per chip associated with the system,
L(C)=the linear core scalability factor, and
E(C)=the exponential core scalability factor.

For system 612, the effective cores per chip result 632 is equal to 3.48 whether the number of processor boards equals 2, 3, or 4 (i.e., $[1+(6-1) \times 0.98] \times 0.90^{(6-1)}=3.48$). In effect, as the number of active cores per chip increases, due to conflicts in accessing resources, the effective cores per chip result does not scale linearly (the exponential factor is less than 1.0).

Alternatively, the effective cores per chip result 632 may be determined according to Equation 2B as follows, which is preferable in some cases, but similarly effective in all other cases:

$$1+[(C-1)\times L(C)]\times E(C)^{(C-1)}, \qquad \text{Equation 2B}$$

where
C=the number of cores per chip associated with the system,
L(C)=the linear core scalability factor, and
E(C)=the exponential core scalability factor.

Next, in step 505 of FIG. 5, system performance analysis device 420, operating as board scalability device 432, determines a fit to board scalability. Specifically, system performance analysis device 420 determines linear and exponential board scalability factors based on the relationships of corresponding measured throughput performance rates 652 associated with N processor boards and N+1 processor boards, and calculates an effective boards result 616 based on the linear and exponential board scalability factors.

For example, FIG. 6 illustrates an exemplary example of the calculation of the expected throughput of a system. As shown in FIG. 6, the number of processor boards 614 for system 612 may include 2 processor boards, 3 processor boards, or 4 processor boards. The measured SPECint2006_Rate (throughput) 652 for the 2, 3 and 4 board configurations are 527, 788 and 1050, respectively. The ratios of these throughput performance values exhibit the scalability of this system as additional boards are added to it. The ratio of the throughput of the three-board system to the two-board system (788/527) is 1.495-almost 1.5. The ratio of the throughput of the four-board to the three-board system (1050/788) is 1.3325-almost 1.33333. The ratio of the throughput of the four-board system to the two-board system (1050/527) is 1.9924-almost 2.0. Clearly, the board scalability of this system is almost "perfect"—doubling the number of boards from 2 to 4 resulted in very nearly doubling the throughput of the system. Since the board scalability appears almost "perfect", initially set the board exponential scalability to 1.0. Now, using the two-to-four board ratio above as a guide, estimate a trial board linear scalability as 0.99. Then, using these trial linear board scalability factor 618 and exponential board scalability factor 620, the effective boards values for each of the 2, 3 and 4 board configuration can be determined from the following equation:

$$[1+(B-1)\times L(B)]\times E(B)^{(B-1)}, \text{ where} \qquad \text{Equation 3A:}$$

B=the number of N boards associated with the system (i.e., N=2, 3, and 4),
L(B)=the linear board scalability factor, and
E(B)=the exponential board scalability factor.

Using these trial scalability factors the computed effective boards results 616 values are 1.99, 2.97 and 3.96, respectively. Use these values to compute scalability ratios corresponding to those previously computed from the measured SPECint2006_Rate throughput. The ratios for the computed effective boards values for three-to-two, four-to-three and four-to-two are 1.4924, 1.3333 and 1.990, respectively. These ratios are almost identical to those computed from the measured throughput values—1.495, 1.3325 and 1.9924, respectively. These board scalability values—0.99 linear and 1.0 exponential—clearly reflect the board scalability expressed in the measured throughput data.

In cases where the computed effective boards ratios do not correspond quite so well to the ratios from the measurement data, some adjustment to the linear and/or exponential board scalability factors may be required to arrive at a set of final board scalability factors.

Alternatively, the effective boards result 616 may be determined according to Equation 3B as follows, which is preferable in some cases, but similarly effective in all other cases:

$$1+[(B-1)\times L(B)]\times E(B)^{(B-1)}, \qquad \text{Equation 3B}$$

where
B=the number of N boards associated with the system (i.e., N=2, 3, and 4),
L(B)=the linear board scalability factor, and
E(B)=the exponential board scalability factor.

Next, in step 506 of FIG. 5, system performance analysis device 420, operating as chip scalability device 430, determines a fit to a chip scalability. Specifically, system performance analysis device 420 determines a fit to chip scalability by determining the number of chips per board associated with system 612, determining linear and exponential scalability factors based on the number of chips per board, and calculating an effective chips per board result based on the linear and exponential chip scalability factors.

Ideally, to determine the chip scalability factors the measured throughput performance data would include measurements with only one chip per board active (and all threads of all cores on that chip active), two chips per board active, etc., up to the maximum number of chips per board for the system under analysis. In practice, this level of detailed performance data is not available but an effective chips per board result 624 can be calculated based on the previously determined effective threads per core result 640, the effective cores per chip result 632, the effective boards result 616 and the measured single thread performance 650 and throughput performance rate 652 of the plurality of measured throughput performance rate. This provides a computed effective chips per board result 624 for each of the throughput performance measurements. Specifically, the set of effective chips per board results 624 is determined according to:

$$P(N)/[SP*EB(N)*EC(N)*ET(N)], \qquad \text{Equation 4}$$

where
N is the number of boards for which a measured throughput performance is known
P(N) is the measured throughput performance 652 for a specific N
SP is the single thread performance 650 of the system
EB(N) is the effective boards value 616 for a specific N
EC(N) is the effective cores value 632
ET(N) is the effective threads value 640

The plurality of computed effective chips per board results 624 will typically be very similar in value, limited by the accuracy and consistency of the measurement data. A mean or median value may be selected from the set for the effective chips per board values.

From this effective chips per board value 624 the linear 626 and exponential 628 scalability factors can be inferred. If there is a maximum of two chips per board for the system under analysis, the chip scalability can be represented with only a linear scalability factor and the exponential scalability factor set to 1.0. For systems with more than two chips per board (e.g., four or eight) it may be necessary to apply some experience from similar systems to select appropriate linear and exponential factors to fit the computed effective chips per board result.

For example, as shown in FIG. 6, system 612 has 4 chips per board 622 for each of 2 processor boards, 3 processor boards, or 4 processor boards. The computed effective chips per board values for the 2, 3, and 4 board configurations are 3.0318, 3.0375, and 3.0356, respectively. An initial estimate of the effective chips per board value may be chosen as 3.035. Note that this estimate was calculated without consideration of operating system scalability. (Determination of operating system "OS" scalability is described in the prior patent.) In the attached spreadsheet operating system scalability is included in the calculation (since the measured throughput performance was subject to OS as well as hardware scalability) so some minor adjustments may be required to the chip scalability when the OS scalability is included. The finalized linear chip scalability factor 626 is determined to be 0.937, and exponential chip scalability factor 628 is determined to be 0.930, resulting in a final effective chips value of 3.07.

The effective chips per board result 624 (i.e., the throughput equivalent number of chips in use per board at any time in view of the available resources) is calculated based on the determined linear chip scalability factor 626 and exponential chip scalability factor 628. Specifically, the effective chips per board result 624 is determined according to:

$$[1+(Ch-1)\times L(Ch)]\times E(Ch)^{\wedge}(Ch-1), \quad \text{Equation 5A}$$

where
Ch=the number of chips per board associated with the system,
L(Ch)=the linear chip scalability factor, and
E(Ch)=the exponential chip scalability factor.

Alternatively, the effective chips per board result 624 may be determined according to Equation 5B as follows, which is preferable in some cases, but similarly effective in all other cases:

$$1+[(Ch-1)\times L(Ch)]\times E(Ch)^{\wedge}(Ch-1), \quad \text{Equation 5B}$$

Ch=the number of chips per board associated with the system,
L(Ch)=the linear chip scalability factor, and
E(C)=the exponential chip scalability factor.

In step 507 of FIG. 5, system performance analysis device 420, operating as total scalability determining device 434, combines (e.g., multiplies) the thread scalability with the core scalability with the chip scalability with the board scalability for each of the number of N processor boards to produce a plurality of total scalability results (i.e., the number of equivalent CPUs) 646, wherein each total scalability result 646 of the plurality of total scalability results is associated with each of the number of N processor boards. For example, as shown in FIG. 6, the total scalability result associated with 2 processor boards is 21, the total scalability result associated with 3 processor boards is 31.43, and the total scalability result associated with 4 processor boards is 41.85. Specifically, the total scalability result is determined according to:

$$\{1+[(B\times Ch\times C\times T)-1]\times L(OS)\}\times E(OS)^{\wedge}[(B\times Ch\times C\times T)-1]\times (Ef(B)/B)\times (Ef(Ch)/Ch)\times (Ef(C)/C)\times (Ef(T)/T), \quad \text{Equation 6A}$$

where
B=the number of boards associated with the system,
Ch=the number of chips per board associated with the system,
C=the number of cores per chip associated with the system,
T=the number of threads per core associated with the system,
L(OS)=the linear OS system scalability factor (e.g., 0.99),
E(OS)=the exponential OS system scalability factor (e.g., 1.00),
Ef(B)=the effective boards,
Ef(Ch)=the effective chips,
Ef(C)=the effective cores, and
Ef(T)=the effective threads.

It is noted that the linear and exponential OS system scalability factors are determined based on the operating system (e.g., the SUSE® LINUX Enterprise Server 10 ("SLES 10")) that is being used by system 612, and may be determined by measuring system parameters. For example, for system 612, the linear OS system scalability factor may be 0.99, and the exponential OS system scalability factor may be 1.00. In addition, it is noted that the computed single thread throughput 648 is determined by dividing each of the plurality of measured throughput performance rates 652 (i.e., determined in step 502) by the total scalability result 646 for each of the number of N processor boards. Consistency with the measured single thread throughput 650 in the plurality of computed single thread throughput 648 is used as one of the checks on correctness of scalability analysis. A monotonic increase or decrease in these values would imply an error in the board scalability analysis; an outlier usually indicates an error in the measured system throughput performance 652.

Alternatively, the total scalability result 646 may be determined according to Equation 6B as follows, which is preferable in some cases, but similarly effective in all other cases:

$$1+\{[((B\times Ch\times C\times T)-1)\times L(OS)]\times E(OS)^{\wedge}[(B\times Ch\times C\times T)-1]\}\times (Ef(B)/B)\times (Ef(Ch)/Ch)\times (Ef(C)/C)\times (Ef(T)/T), \quad \text{Equation 6A}$$

where
B=the number of boards associated with the system,
Ch=the number of chips per board associated with the system,
C=the number of cores per chip associated with the system,
T=the number of threads per core associated with the system,
L(OS)=the linear OS system scalability factor (e.g., 0.99),
E(OS)=the exponential OS system scalability factor (e.g., 1.00),
Ef(B)=the effective boards,
Ef(Ch)=the effective chips,
Ef(C)=the effective cores, and
Ef(T)=the effective threads.

Then, in step 508 of FIG. 5, system performance analysis device 420, operating as expected throughput determining device 436, multiplies each of the plurality of total scalability results 646 with the measured single thread performance 650 (i.e., the amount of work performed by a single thread in a single core in a single chip in a single board of the system) determined in step 501. For example, as shown in FIG. 6, for 2 processor boards, the expected throughput of the system 654 is determined to be 527.15 (i.e., 21×25.1). For 3 processor boards, the expected throughput of the system 654 is determined to be 788.81 (i.e., 31.43×25.1). For 4 processor boards, the expected throughput of the system 612 is determined to be 1050.47 (i.e., 41.85×25.1). In comparing the expected throughput of the system 654 with the measured throughput performance rates 652 for each of the number of N processor boards (i.e., determined in step 502), it can be seen that the expected throughput of the system 654 is determined to be very close to the measured throughput performance rates 652. Thus, using the above-discussed process, an improved correspondence between the measured and computed performance of system 612 can be achieved, resulting in the determination of board, chip, core, and thread scalability factors that can better predict real-life system performance.

Referring now to FIGS. 7-10, processes performed by system performance prediction module 470, which employing the above-determined scalability factors to multi-board, multi-chip, multi-core, multi-thread system architectures for the purposes of capacity planning (e.g., by computing the predicted throughput of a specific system), is now described.

Figure 7:
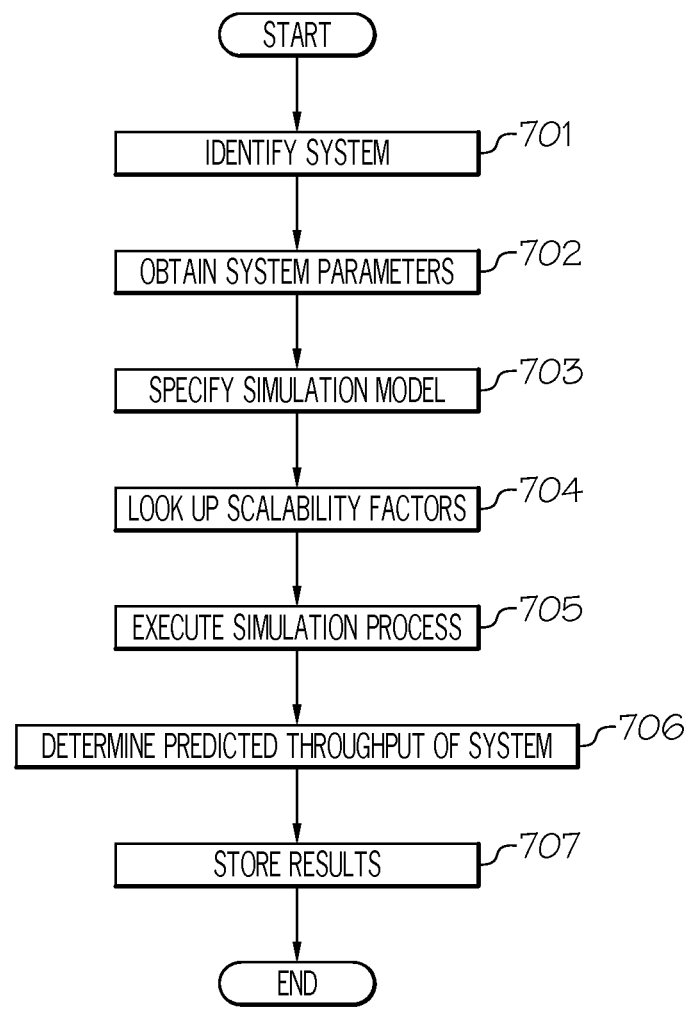
FIG. 7 illustrates a flow diagram of the method performed by the system performance prediction module, in accordance with a particular embodiment of the present disclosure.

Referring first to FIG. 7, in step 701, system performance prediction module 470 may identify a system for which performance prediction is desired.

In step 702, system performance prediction module 470, operating as system configuration data determining device 472, obtains configuration data for the system. For example, system performance prediction module 470 may obtain data from data repository 480 (e.g., which may be stored in memory 402 of system 400), as shown in FIG. 8. Performance data is tabulated into a set of records 800, wherein each record represents a system configuration containing at least a system description 802, a processor board type 804, a number of processor boards in the system 806, a processor chip type 808, a number of chips per board 810, a number of cores per chip 812, a number of threads per core 814, a measured single thread throughput performance S_meas 816, and a measured system throughput performance rate R_meas 818. The measured performances 816 and 818 are preferably the SPECint2006 and the SPECint_rate2006 from Standard Performance Evaluation Corporation (SPEC) (which may be found on the World Wide Web at www.spec.org). In one embodiment, SPECint2006 and SPECint_rate2006 data may be periodically scraped from the SPEC website. Alternatively, this performance data may be obtained from other sources such as actual lab measurements or from systems manufacturers. In addition, system configuration data determining device 472 may further obtain data on hardware resources (e.g., disk drives, memory, and network interface cards), network topography (e.g., describing how the system is interconnected including software dependencies), applications that will run on the system and be simulated, and workload information (e.g., the rate at which applications submit CPU requests to the system, measured CPU utilizations for workloads, etc.).

Figure 10:
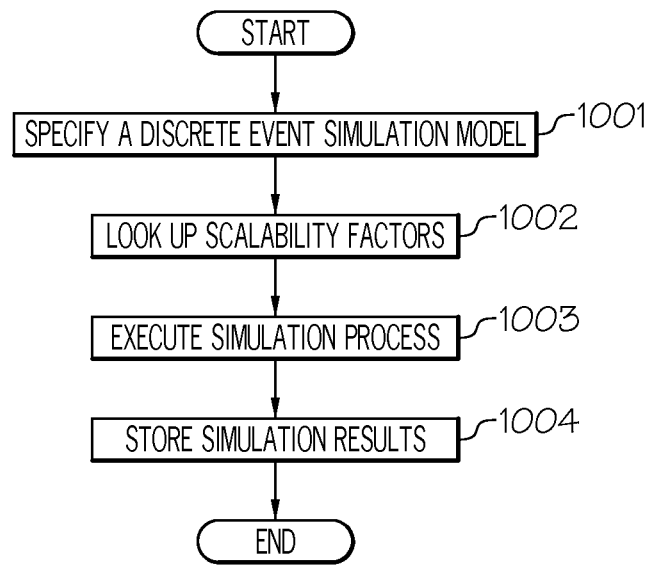
FIG. 10 illustrates a discrete event simulation process, in accordance with a particular embodiment of the present disclosure.

Proceeding with FIG. 7, in step 703, system performance prediction module 470 may specify a simulation model, as will be further explained with regard to FIGS. 10 and 11 below. Then, in step 704, system performance prediction module 470, operating as scalability factors collecting device 474, may look up scalability factors from stored scalability factors (e.g., from data repository 460) including linear scalability factors and exponential scalability factors collected based on the specific system configuration. For example, as discussed in detail above with regard to FIGS. 5 and 6, for a Unisys ES7000 Model 7600R system with a Xeon X7460 processor, the scalability factors for board scalability, chip scalability, core scalability, and thread scalability (i.e., taken from FIG. 6) are shown in Table 900 of FIG. 9.

Going back to FIG. 7, in step 705, system performance prediction module 470, operating as simulation execution device 476, may use the scalability factors for the system of interest in the execution of a simulation process for a predetermined simulation time, and then stops the simulation process after it has reached the predetermined end time and outputs a set of results. Then, in step 706, system performance prediction module 470, operating as an expected throughput determining device 478, may determine the throughput of the system and predict the performance of the specific system configuration of the multi-board, multi-chip, multi-core, multi-thread system from the set of simulation results.

In step 707, system performance prediction module 470, operating as a results storage device 480, may store the results of the simulation process (e.g., in memory 452 or another suitable storage device). After the results are stored, the process terminates.

Different types of results may be determined based on different modeling techniques. For example, FIG. 10 illustrates an example of a discrete event simulation process for analyzing the performance of a computer system configuration. In step 1001, system performance prediction module 470 may specify a discrete event simulation model of a computer system configuration using the system parameters described above. Then, in step 1002, system performance prediction module 470 looks up the relevant scalability factors based on the system architecture (e.g., the multi-board, multi-chip, multi-core, multi-thread system). Next, in step 1003, system performance prediction module 470, using the system parameters and scalability factors, executes the simulation process until a predetermined simulation condition has been reached, at which point the simulation stops. (Predetermined simulation conditions may include, but not be limited to, wall clock simulation elapsed time, a maximum simulated time, achieving a minimum level of statistical stability of results, or a variety of internal conditions such as simulation of the completion of a given number of transactions.) In step 1004, system performance prediction module 470 stores the simulation results, which may include at least average response times for CPU requests and average CPU utilizations, and may also include "break-out" results such as CPU utilization by specific users, user classes, specific applications or transaction types; and larger scale results such as user end-to-end response time including other resource usage. After simulation results are stored, the process terminates.

Figure 11:
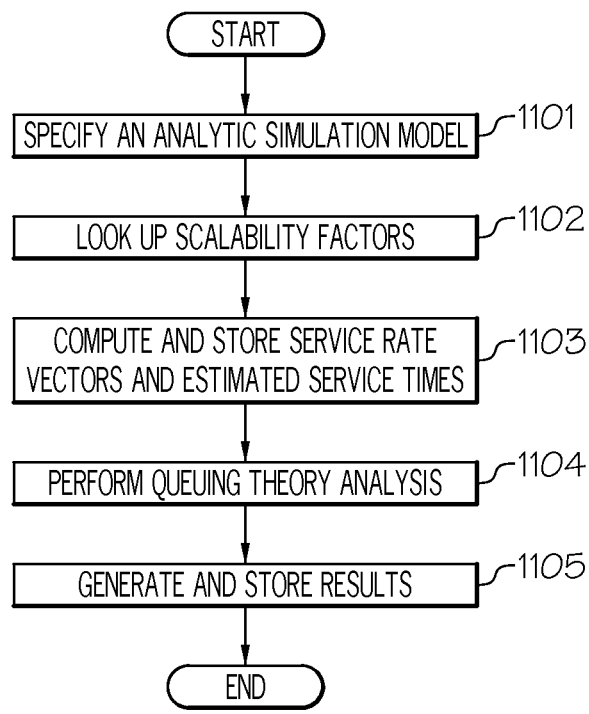
FIG. 11 illustrates an analytic simulation process, in accordance with a particular embodiment of the present disclosure

As another example, FIG. 11 illustrates an example of an analytic simulation process for analyzing performance of a computer system configuration. In step 1101, system performance prediction module 470 may specify an analytic model of a computer system configuration using the system parameters described above. Then, in step 1102, system performance prediction module 470 looks up the relevant scalability factors based on the system architecture (e.g., the multi-board, multi-chip, multi-core, multi-thread system), in addition to system scalability factors (e.g., scalability factors that are stored in the memory of the host machine and are available for use in analytic calculations to compute service rate vectors and estimated service times per workload used for standard queuing theory analysis). Next, in step 1103, system performance prediction module 470 computes and stores service rate vectors and estimated service times (based on both the scalability factors associated with the system architecture and the system scalability factors). Then, in step 1104, the stored service rate vectors and estimated service times are used to perform queuing theory analysis. After queuing theory analysis is complete, in step 1105, results are generated and stored, and these results may include at least the average response time per workload and the estimated average CPU utilization per workload or per sets of workloads submitted at certain submission rates. After results are stored, the process terminates.

The flowchart and block diagrams in FIGS. 1-11 illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

What is claimed is:

1. A computer-implemented method, comprising:
   identifying a system for which system performance prediction is desired;
   specifying a simulation model;
   determining configuration parameters for the system, the system comprising a plurality of processor boards, at least one chip per processor board, at least one core per chip, and at least one thread per core;
   configuring the simulation model using the configuration parameters including a system description, a processor board type, a number of processor boards in the plurality of processor boards, a processor chip type, a number of chips per processor board, a number of cores per chip, and a number of threads per core;
   obtaining scalability factors based on the configuration data for the system;
   executing a simulation process for the simulation model for a deterministic simulation time;
   calculating a throughput of the system as a prediction of the performance of the system;
   storing the results in a storage device; and
   wherein calculating a throughput of the system as a prediction of the performance of the system comprises calculating a first throughput of a first system having N processor boards, and further comprising:
      calculating a second throughput of a second system having N+1 processor boards; and
      determining a ratio of the second throughput to the first throughput.

2. The method of claim 1, wherein the simulation model comprises one of:
   a discrete event simulation process, and
   an analytic simulation process.

3. The method of claim 1, wherein the step of determining configuration parameters for the system further comprises:
   identifying a plurality of processor boards available to run a set of tasks;
   identifying a plurality of chips per board for each the processor boards;
   identifying a plurality of cores per chip for each of the chips;
   identifying a plurality of threads per core for each of the cores; and
   determining a total number of available threads.

4. The method of claim 1, wherein the scalability factors include linear scalability factors and exponential scalability factors for each of board scalability, chip scalability, core scalability, and thread scalability, and further comprising displaying the results to a user using an I/O device.

5. The method of claim 4, wherein the scalability factors are determined by:
   determining an amount of work performed by a single thread in a single core in a single chip in a single board of the system comprising a number of N processor boards, where N is an integer greater than or equal to 1;
   determining a maximum throughput performance rate associated with a configuration of one or more boards of the system comprising a number of N processor boards, where N is an integer greater than or equal to 1;
   determining a plurality of measured throughput performance rates for the system;
   determining a fit to a thread scalability;
   determining a fit to a core scalability;
   determining a fit to a board scalability based on the plurality of measured throughput performance rates;
   determining a fit to a chip scalability based on the thread scalability, the core scalability, the board scalability, and the plurality of measured throughput performance rates;
   multiplying the thread scalability with the core scalability with the chip scalability with the board scalability for each of the number of N processor boards to produce a plurality of total scalability results, each total scalability result of the plurality of total scalability result associated with each of the number of N processor boards; and
   multiplying each of the plurality of total scalability results with the amount of work associated with a single thread in a single core in a single chip in a single board of the system to produce an expected throughput of the system configured with each of the number of N processor boards.

6. The method of claim 1, wherein the scalability factors include a board scalability factor based at least in part upon a number of processor boards of the system and wherein the number of processor boards is greater than one.

7. The method of claim 1, further comprising:
calculating a third throughput of a third system having N+2 processor boards; and
determining a ratio of the third throughput to the second throughput.

8. The method of claim 1, wherein calculating the throughput of the system further comprises calculating the throughput of each user of the system.

9. A system comprising:
a system performance prediction device configured to:
identify or allow identification of a system for which system performance prediction is desired, and
specify or allow specification of a simulation model;
a system configuration data determining device configured to determine configuration parameters for the system, the system comprising a plurality of processor boards, at least one chip per board, at least one core per chip, and at least one thread per core, and a workload specification;
the system configuration data determining device being further configured to configure the simulation model using the configuration parameters including a system description, a processor board type, a number of processor boards in the system, a processor chip type, a number of chips per board, a number of cores per chip, and a number of threads per core;
a scalability factors collecting device configured to obtain scalability factors based on the configuration data for the system, the scalability factors including a board scalability factor based at least in part upon a number of processor boards of the system;
a simulation execution device configured to execute a simulation process for the simulation model for a deterministic simulation time;
an expected throughput determining device configured to:
calculate a first throughput of a first system having N processor boards;
calculate a second throughput of a second system having N+1 processor boards; and
determine a ratio of the second throughput to the first throughput; and
a results storage device configured to store the results in a storage device.

10. The system of claim 9, wherein the simulation process comprises one of:
a discrete event simulation process, and
an analytic modeling process.

11. The system of claim 9, wherein the system configuration data determining device is further configured to:
determine a number of processor boards available to run a set of tasks;
determine a number of chips per board for each the processor boards;
determine a number of cores per chip for each of the chips;
determine a number of threads per core for each of the cores;
determine a total number of available threads; and
determine a workload specification.

12. The system of claim 9, wherein the scalability factors include linear scalability factors and exponential scalability factors for each of board scalability, chip scalability, core scalability, and thread scalability.

13. The system of claim 12, wherein the scalability factors are determined by:
a work determining device configured to determine an amount of work performed by a single thread in a single core in a single chip in a single board of the system comprising a number of N processor boards, where N is an integer greater than 1;
a work determining device configured to determine a maximum throughput rate associated with a configuration of one or more boards of a system comprising a number of N processor boards;
a throughput performance determining device configured to determine a plurality of measured throughput performance rates for the system;
a thread scalability determining device configured to determine a fit to a thread scalability;
a core scalability determining device configured to determine a fit to a core scalability;
a board scalability determining device configured to determine a fit to a board scalability based on the plurality of measured throughput performance rates;
a chip scalability determining device configured to determine a fit to a chip scalability based on the thread scalability, the core scalability, the board scalability, and the plurality of measured throughput performance rates;
a total scalability determining device configured to multiply, via the system performance prediction module, the thread scalability with the core scalability with the chip scalability with the board scalability for each of the number of N processor boards to produce a plurality of total scalability results, each total scalability result of the plurality of total scalability result associated with each of the number of N processor boards; and
an expected throughput determining device configured to multiply, via the system performance prediction module, each of the plurality of total scalability results with the amount of work associated with a single thread in a single core in a single chip in a single board of the system to produce an expected throughput of the system for each of the number of N processor boards.

14. The system of claim 9, wherein the board scalability factor comprises a linear board scalability factor and wherein the scalability factors further include an exponential board scalability factor.

15. A computer program product comprising:
a non-transitory computer-readable storage medium having computer-readable program code embodied therewith, the computer-readable program code comprising:
computer readable program code configured to
identify or allow identification of a system for which system performance prediction is desired, and
specify or allow specification of a simulation process;
computer readable program code configured to determine configuration parameters for the system, the system comprising a plurality of processor boards, at least one chip per board, at least one core per chip, and at least one thread per core;
computer readable program code configured to configure the simulation model using the configuration parameters including a system description, a processor board type, a number of processor boards in the system, a processor chip type, a number of chips per board, a number of cores per chip, and a number of threads per core;

computer readable program code configured to obtain scalability factors based on the configuration data for the system, the scalability factors including a board scalability factor based at least in part upon a number of processor boards of the system;

computer readable program code configured to execute a simulation process for the simulation model for a deterministic simulation time;

computer readable program code configured to calculate a first throughput of a first system having N processor boards;

computer readable program code configured to calculate a second throughput of a second system having N+1 processor boards; and computer readable program code configured to determine a ratio of the second throughput to the first throughput; and computer readable program code configured to store the results in a storage device.

16. The method of claim 6, wherein the board scalability factor comprises a linear board scalability factor and wherein the scalability factors further include an exponential board scalability factor.

* * * * *